(12) United States Patent
Bianco et al.

(10) Patent No.: US 12,620,998 B2
(45) Date of Patent: May 5, 2026

(54) METHODS AND CIRCUITS FOR ELECTRICAL POWER SUPPLY

(71) Applicant: STMICROELECTRONICS S.r.l., Agrate Brianza (IT)

(72) Inventors: Alberto Bianco, Gressan (IT); Francesco Ciappa, Borgofranco d'Ivrea (IT); Donato Bondetti, Montalto Dora (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 172 days.

(21) Appl. No.: 18/415,485

(22) Filed: Jan. 17, 2024

(65) Prior Publication Data
US 2024/0250691 A1 Jul. 25, 2024

(30) Foreign Application Priority Data
Jan. 20, 2023 (IT) ........................ 102023000000819

(51) Int. Cl.
*H03M 1/10* (2006.01)
*H03M 1/12* (2006.01)
(Continued)

(52) U.S. Cl.
CPC ........... *H03M 1/125* (2013.01); *H03M 1/368* (2013.01); *H03M 1/462* (2013.01)

(58) Field of Classification Search
CPC ...... G01R 31/52; G01R 35/005; G01R 31/50; G01R 31/54; G01R 31/68; G01R 1/06788; G01R 13/029; G01R 13/345; G01R 27/14; G01R 27/18; G01R 27/28; G01R 31/11; G01R 31/58; G01R 31/66; G01R 1/06766; G01R 1/206; G01R 13/02; G01R 15/125; G01R 19/0084; G01R 19/25; G01R 19/2509; G01R 27/02; G01R 27/32; G01R 31/002; G01R 31/006; G01R 31/1272; G01R 31/2607; G01R 31/28; G01R 31/2817; G01R 31/2822; G01R 31/3004; G01R 31/3008; G01R 31/31716;
(Continued)

(56) References Cited

U.S. PATENT DOCUMENTS

| | | | | |
|---|---|---|---|---|
| 6,023,960 A * | 2/2000 | Abrams | .................. | G01P 21/00 73/1.01 |
| 6,907,363 B1 * | 6/2005 | Wyant | .................... | G01R 27/18 702/65 |
| 7,012,433 B2 * | 3/2006 | Smith | ................. | G01R 31/3648 324/426 |
| 7,023,691 B1 * | 4/2006 | Feight | .................... | G01R 31/50 324/510 |

(Continued)

FOREIGN PATENT DOCUMENTS

WO WO 2017099768 A1 6/2017

*Primary Examiner* — Linh V Nguyen
(74) *Attorney, Agent, or Firm* — Seed Intellectual Property Law Group LLP

(57) ABSTRACT

A circuit includes at least one coupling node configured to be coupled, via a cable, to a load to transmit a supply voltage thereto. The circuit includes test circuitry configured to sense at least one sensing signal indicative of a value of the cable impedance and/or of the cable voltage across the cable, to perform a comparison between the at least one sensing signal and at least one threshold indicative either of a threshold resistance value for the cable impedance or indicative of a threshold voltage value for the cable voltage, produce a comparison signal as a result of the comparison.

13 Claims, 10 Drawing Sheets

(51) Int. Cl.
  *H03M 1/36*          (2006.01)
  *H03M 1/46*          (2006.01)

(58) Field of Classification Search
  CPC .......... G01R 31/3172; G01R 31/31725; G01R
              31/31726; G01R 31/3177; G01R
              31/318516; G01R 31/319; G01R
        31/31924; G01R 31/3277; G01R 31/343;
          G01R 31/3648; G01R 31/379; G01R
          31/385; G01R 31/69; G06F 1/266; G06F
          1/1613; G06F 1/1684; G06F 1/324; G06F
            1/3296; G06F 11/221; G06F 13/385;
            G06F 13/4072; G06F 13/4282; G06F
          21/44; G06F 21/79; G06F 21/81; G06F
          21/86; G06F 2221/2129; H01R 2107/00;
            H01R 13/7135; H01R 24/60; H01R
          24/62; H01R 24/64; H01R 31/06; H01R
          31/08; H02H 1/0007; H02H 3/044; H02H
            3/05; H02H 3/20; H02H 1/003; H02H
            3/00; H02H 3/08; H02H 3/16; H02H
          7/1213; H02H 7/20; H02H 9/02; H03M
                                        1/10
  USPC ................................................. 341/120, 155
  See application file for complete search history.

(56)                References Cited

U.S. PATENT DOCUMENTS

|  |  |  |  |  |
|---|---|---|---|---|
| 7,508,228 | B2 * | 3/2009 | Walker ............... | G01R 31/3004 |
|  |  |  |  | 324/750.3 |
| 8,867,245 | B1 * | 10/2014 | Hwang ............... | H02M 1/4225 |
|  |  |  |  | 363/21.04 |
| 8,878,484 | B2 * | 11/2014 | Mullins .................... | H02H 9/02 |
|  |  |  |  | 320/132 |
| 9,362,765 | B1 * | 6/2016 | Blaszczak ............ | H01R 31/065 |
| 9,385,489 | B2 * | 7/2016 | Wang ..................... | H01R 13/70 |
| 10,571,499 | B2 * | 2/2020 | Shi .......................... | G01R 31/52 |
| 2016/0146877 | A1 | 5/2016 | Kesterson et al. |  |
| 2017/0294832 | A1 | 10/2017 | Aoki |  |
| 2018/0013300 | A1 | 1/2018 | Yao et al. |  |
| 2018/0019587 | A1 | 1/2018 | Chen et al. |  |
| 2018/0059771 | A1 | 3/2018 | Kim et al. |  |
| 2019/0319447 | A1 | 10/2019 | Mukhopadhyay et al. |  |
| 2020/0014379 | A1 * | 1/2020 | Telefus .................... | H02H 3/08 |
| 2020/0059047 | A1 | 2/2020 | Kim |  |
| 2021/0099172 | A1 * | 4/2021 | Kang ............. | H03K 19/018578 |
| 2022/0077672 | A1 | 3/2022 | Mevada et al. |  |
| 2022/0399174 | A1 * | 12/2022 | Telefus ................. | H02H 3/385 |
| 2023/0311692 | A1 * | 10/2023 | Scholz .................. | B60L 3/0069 |
|  |  |  |  | 320/109 |

* cited by examiner

METHODS AND CIRCUITS FOR ELECTRICAL POWER SUPPLY

BACKGROUND

Technical Field

The description relates to methods and circuits for providing an electrical power supply to load circuitry.

For instance, the description relates to detecting fault conditions such as low impedance and/or overvoltage which may occur in input/output (briefly, I/O) cables and circuitry during power supply operations.

One or more embodiments may be applied to connectors for electrical power supply designed according to the Universal Serial Bus (briefly, USB) standard, such as type-C USB connectors, for instance.

Description of the Related Art

Over time, USB has evolved from being a data interface capable of supplying limited power to becoming a power provider with an auxiliary data interface.

While connected to a power supply, a USB cable for power delivery (briefly, USB-PD) may accidentally be damaged, for instance an internal short circuit among internal wires may be the due to pets chewing on the cable or to a conductive liquid (such as milk, for instance) accidentally wetting the free end of the cable. In these scenarios, there is an interest in controlling the power delivery in order to limit damages to the cable and the power supply.

BRIEF SUMMARY

One or more embodiments contribute in addressing the issues discussed in the foregoing.

One or more embodiments may be equipped on a (e.g., USB) power adapter for battery-powered electronic devices, for instance.

One or more embodiments facilitate detecting an impedance across USB cables using a single node, such as a general purpose I/O node.

One or more embodiments advantageously use relatively simple means to adapt to any microcontroller device.

One or more embodiments facilitate interrupting power delivery in response to fault detection (e.g., due to reduced impedance or overvoltage).

One or more embodiments envisage periodically testing the USB cable conditions without affecting normal operation.

In one embodiment, a circuit includes at least one coupling node configured to be coupled, via a cable, to a load to transmit a supply voltage thereto, the cable having a cable impedance and configured to carry a cable voltage and test circuitry coupled to the at least one coupling node. The test circuitry is configured to sense at least one sensing signal indicative of a value of the cable impedance and/or of a cable voltage across the cable and perform a comparison between the at least one sensing signal and at least one threshold indicative either of a threshold resistance value for the cable impedance or indicative of a threshold voltage value for the cable voltage. The test circuitry is configured to produce a comparison signal as a result of the comparison, the comparison signal having a first logic value or a second logic value, as a result of the at least one sensing signal reaching or failing to reach the at least one threshold and assert a flag signal based on the logic value of the comparison signal, the flag signal being indicative of the value of the cable impedance being lower than the threshold resistance value or being indicative of a cable voltage across the wired cable being greater than the threshold voltage value.

In one embodiment, a method includes coupling at least one coupling node, via a cable, to a load to transmit a supply voltage thereto, the cable having a cable impedance and configured to carry a cable voltage and sensing at least one sensing signal indicative of a value of the cable impedance or of the cable voltage across the cable. The method includes performing a comparison between the at least one sensing signal and at least one threshold indicative either of a threshold resistance value for the cable impedance or indicative of a threshold voltage value for the cable voltage and producing a comparison signal as a result of the comparison, the comparison signal having a first logic value or a second logic value based on the at least one sensing signal reaching or failing to reach the at least one threshold. The method includes asserting a flag signal based on the logic value of the comparison signal, the asserted flag signal being indicative of the value of the cable impedance being lower than the threshold resistance value, or being indicative of a cable voltage across the wired cable being greater than the threshold voltage value.

In one embodiment, a device includes a transmission interface. The transmission interface includes a first coupling node configured to be coupled to a cable, a sensing circuit coupled to the first coupling node and configured to sense an electrical quantity of the cable via the first coupling node, and a testing circuit coupled to the sensing circuit and configured to provide a signal indicative of an operational condition of the cable based on the electrical quantity. The interface includes a control circuit coupled to the testing circuit and configured to drive the testing circuit block to perform a test on the coupling node and to receive the signal from the testing circuit based on the test.

BRIEF DESCRIPTION OF THE SEVERAL VIEWS OF THE DRAWINGS

One or more embodiments will now be described, by way of non-limiting example only, with reference to the annexed Figures, wherein:

FIG. 1 is an exemplary diagram of test circuitry for electrical power supply;

FIG. 2 is an exemplary diagram of alternative test circuitry for electrical power supply;

FIG. 4 is an exemplary diagram of a solution as per the present disclosure;

FIG. 6 is an exemplary diagram of an alternative solution as per the present disclosure.

Corresponding numerals and symbols in the different figures generally refer to corresponding parts unless otherwise indicated.

Figure 3:
FIG. 3 is a time diagram of signals involved in using the test circuitry exemplified in FIG. 1 or 2.
Figure 3:
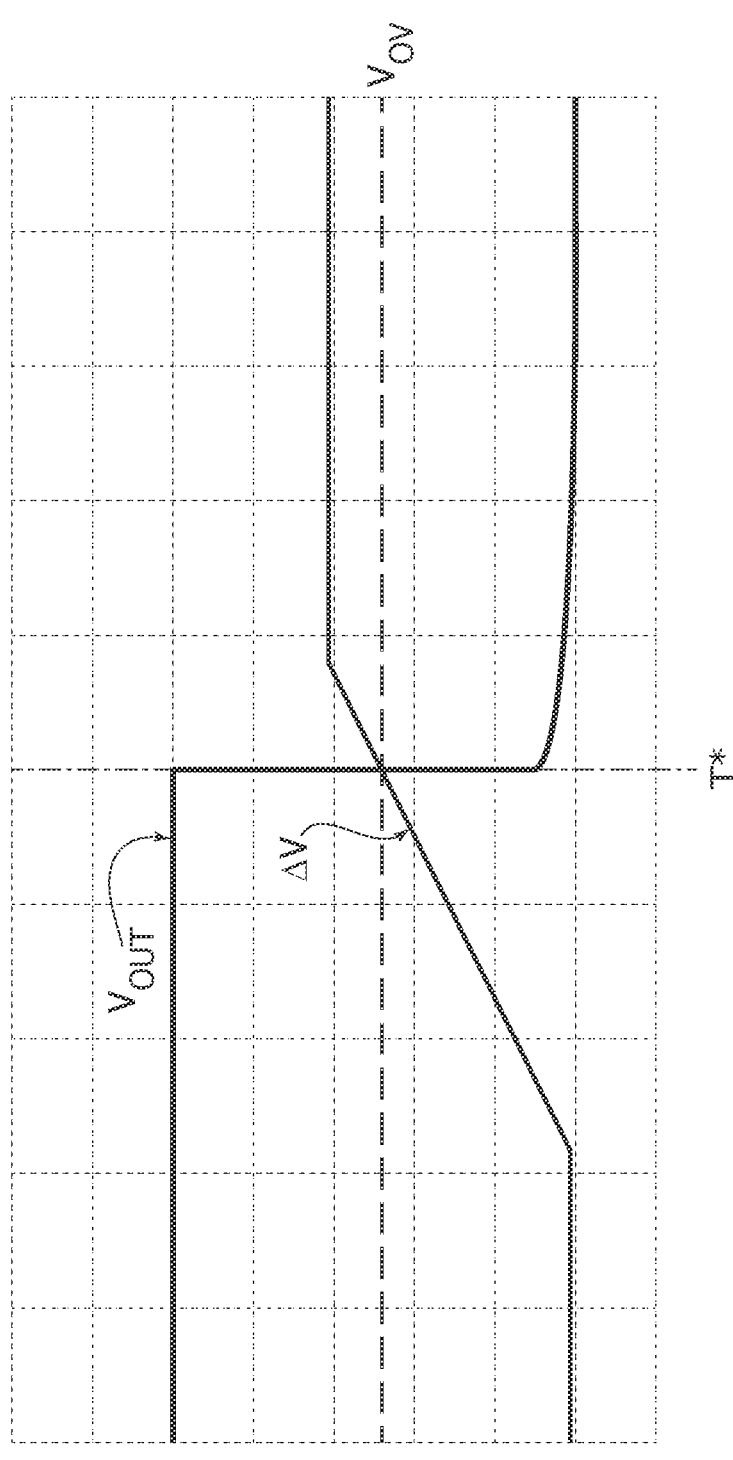

The figures are drawn to clearly illustrate the relevant aspects of the embodiments and are not necessarily drawn to scale.

The edges of features drawn in the figures do not necessarily indicate the termination of the extent of the feature.

DETAILED DESCRIPTION

In the ensuing description, one or more specific details are illustrated, to assist in providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The drawings are in simplified form and are not to precise scale.

The references used herein are provided merely for convenience and hence do not define the extent of protection or the scope of the embodiments.

Figure 1:
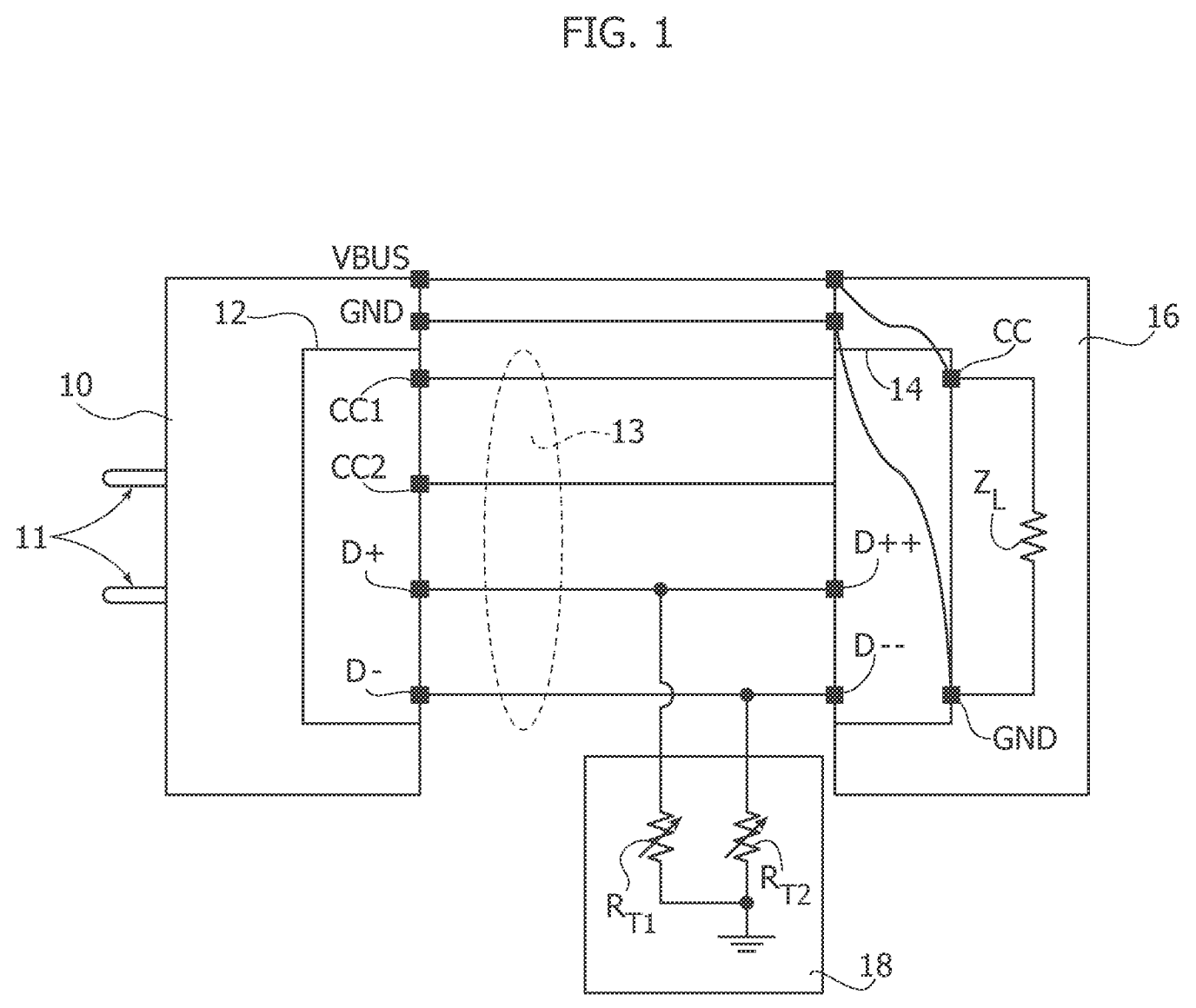

As exemplified in FIG. 1, a (e.g., USB) power adapter 10 is an electric device that is used to provide an electrical power supply an electrical device 16 (e.g., to charge the battery thereof) using a (e.g., USB) wired cable 13 as a way to transmit the electrical power supply. For instance, the adapter 10 includes and AC/DC converter (or AC adapter, AC/DC adapter or A/C adapter), known per se, to convert the AC power from the plug to a suitable DC level which can be provided to the load 16 via the wired cable 13.

As exemplified in FIG. 1, the power adapter 10 includes a power transmitting interface 12 configured to engage with a first port of the wired cable 13, such as a universal serial bus-power delivery (briefly, USB-PD or USB) interface.

Currently, a USB connector interface 12 is present in a wide range of power adapters 11, in particular battery chargers for charging the battery of portable electronic devices.

As exemplified in FIG. 1, the power adapter 10 includes:
a plug 11 configured to be coupled to a power-supply socket to receive an AC supply voltage therefrom;
an AC/DC converter (not shown) configured to convert the AC supply voltage to a DC supply voltage suitable for the load 16; and
a (e.g., USB) power transmitting interface 12 (per se known) configured to be coupled to the (e.g., USB) wired cable 13 to provide the supply voltage therewith to the load 16.
As exemplified in FIG. 1, the load 16 includes:
a (e.g., USB) power receiving interface 14 configured to receive the adapted power supply 10 provided from the power adapter 10 via a respective port of the (e.g., USB) cable 13 coupled thereto; and
an electrical load 16, e.g., a resistive load $Z_L$ of some portable device to be charged with the received adapted voltage.
As exemplified in FIG. 1, the (e.g., USB) wired cable 13 is configured to be coupled to the power transmitting interface 12 of the adapter 10 to receive the power supply voltage therefrom and to the power receiving interface 14 of the load 16 to transmit thereto the supply voltage received from the power transmitting interface 12.

As exemplified in FIG. 1, the transmitting 12 and receiving 14 interfaces include respective coupling nodes D+, D−, D++, D−− to transmit/receive communications and/or communication nodes CC1, CC2 to perform other known operations thereby.

For instance, in the exemplary case of power interfaces 12, 14 of the USB type, the various nodes include:
coupling nodes D+, D− on the side of the power adapted and respective coupling nodes D++, D−− on the side of the load 16; and
further nodes CC1, CC2 to communicate with the load 14 and determine the power level thereof.

It is noted that there may be also other nodes or coupling between nodes, not shown for the sake of simplicity of the figures.

For the sake of simplicity, one or more embodiments will be described in the following mainly with reference to a USB-kind of cable 13 and power interfaces 12, 14, being otherwise understood that such a kind of connector is purely exemplary and in no way limiting.

Figure 2:
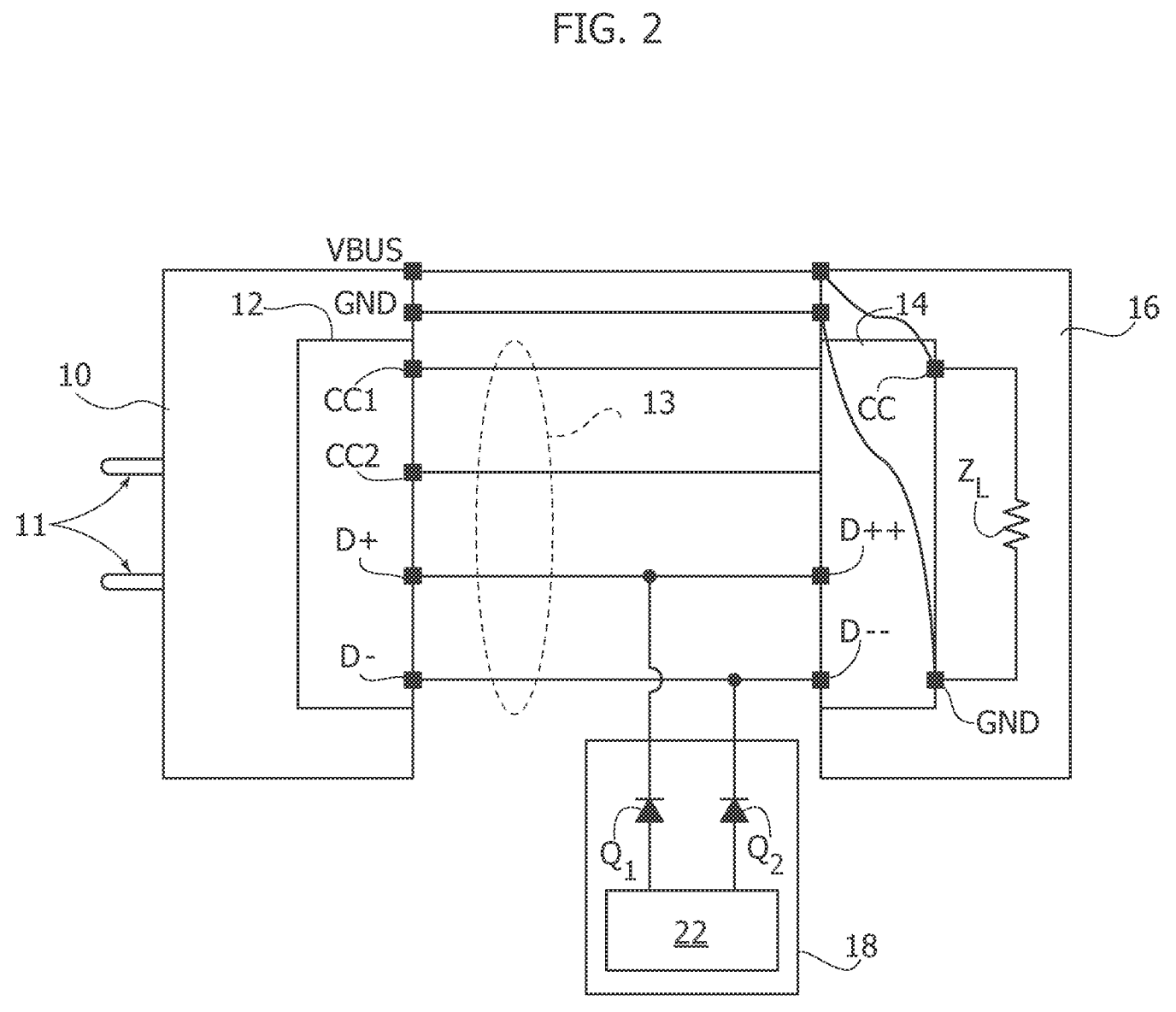

As exemplified in FIGS. 1 and 2, a set of test devices 18, 20 may be used to test the reliability of the device 10 in the presence of a malfunctioning with respect to the wired cable 13 connection of communication pins D+, D−.

For instance:
a first test device 18 may be configured to test the cable impedance across the first coupling nodes D+, D− and ground to simulate the presence therebetween of an impedance towards ground lower than a threshold value $R_{SHORT}$, indicating the risk of a short-circuit; and
a second test device 20 may be configured to simulate a condition in which the voltage across either one the first D+, D++ on the interface 12 and ground is higher than a certain threshold level, in order to detect any overvoltage condition therebetween which may result from a short circuit among either one of nodes D+, D− and a supply voltage (e.g., VBUS).

As exemplified in FIGS. 1 and 2, test devices 18, 20 facilitate to satisfy constraints (e.g., provided by the USB standards or by the specific application) regarding the impedance and voltage levels at the coupling nodes D+, D−. For example, in a power adapter 10 (whether adopting the so-called battery charging USB/USB-BC profile or not), the test devices 18, 20 may be used to verify whether two nodes D+, D− at the first interface 12 have a resistance across either one of D+, D− and ground which is lower than a resistance threshold value $R_{SHORT}$ (e.g., $R_{SHORT}=200\Omega2$) referred to ground.

As exemplified in FIG. 1, a first test device 18 for safety testing with respect to the resistance threshold includes:
a first resistive element $R_{T1}$ having a first variable resistance $R_{T1}$, the first resistive element $R_{T1}$ coupled between the first coupling node D+ and ground; and
a second resistive element $R_{T2}$ having a second variable resistance $R_{T2}$, the second resistive element $R_{T2}$ coupled between the second coupling node D− and ground.

The first test device 18 as exemplified in FIG. 1 is configured to gradually reduce the values of the first or second variable resistances $R_{T1}$, $R_{T2}$ until the value drops below the resistance threshold value $R_{SHORT}$. In response to detecting a resistance below the threshold, the cable 13 may be labeled as a faulty cable.

As exemplified in FIG. 2, a second test device 20 for a further or alternative safety testing of the apparatus 10 includes:

an auxiliary power supply 22 configured to provide a variable voltage level;

a first diode Q1 coupled between the first coupling node D+ of the interface 12 and the auxiliary power supply 20; and a second diode Q2 coupled between the second coupling node D− and the auxiliary power supply 20.

The second test device 20 as exemplified in FIG. 2 is configured to gradually increment the voltage level provided by the auxiliary power supply 22 until it reaches or exceeds a voltage threshold level $V_{OV}$ (e.g., $V_{OV}$ about 5V). In response to detecting a voltage above the voltage threshold level, the cable 13 may be labeled as a faulty cable.

FIG. 3 is an exemplary diagram showing an output voltage $V_{OUT}$ provided by the power supply 11 as a function of time during the variation of the voltage across either one of the nodes D+, D− and ground when coupled to the auxiliary voltage source 22 via the diodes Q1, Q2.

As illustrated in FIG. 2, at time instant T*, that is as soon as the voltage drop $\Delta V$ across either one of the coupling nodes D+, D− and ground reaches the voltage threshold level $V_{OV}$, the output voltage $V_{OUT}$ goes from a supply voltage level to zero.

Figure 4:
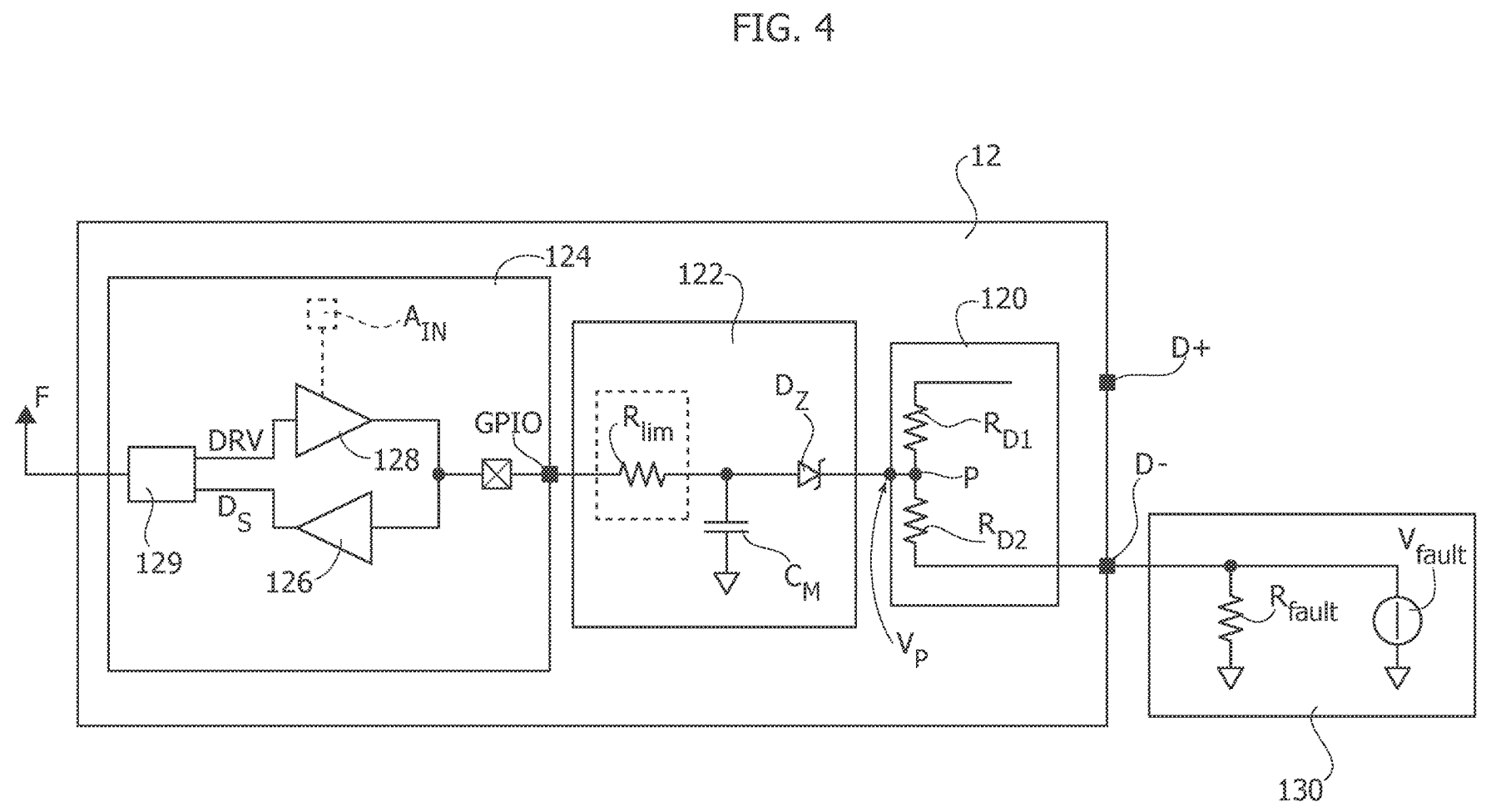

As exemplified in FIG. 4, an improved power interface 12 as per the present disclosure includes:

a sensing circuit block 120 coupled to the coupling nodes D+, D− and configured to sense an electrical quantity (e.g., voltage) among (or at least one of) the first coupling node D+ and the second coupling node D− of the power interface 12;

a testing circuit block 122 coupled to the sensing circuit block 120, the testing circuit block 122 including test circuitry configured to provide a signal indicative of an operational condition of the cable 13 coupled to the coupling nodes D+, D− based on the electrical quantity received therefrom; and a control circuit block 124 coupled to the testing circuit block 122, the control circuit block 124 configured to drive the testing circuit block 122 to perform at least one testing method and to receive the signal indicative of the operational condition of the cables from the testing circuit block 122 as a result of performing the at least one testing method.

An arrangement as exemplified in FIG. 4 facilitates integrating safety testing procedures directly into the power interface 12, therefore increasing reliability thereof.

As exemplified in FIG. 4, the sensing circuit block 120 includes a first resistive element $R_{D1}$ and a second resistive element $R_{D2}$ (e.g., both having a same resistance $R_{D1}=R_{D2}$), the first resistive element $R_{D1}$ being coupled to the first coupling pin D+ and to a common node P while the second resistive element $R_{D2}$ is coupled to the second coupling pin D− and to the common node P. For instance, the first and second resistive elements $R_{D1}$, $R_{D2}$ provide a sensing signal $V_P$ as a fraction of the voltage drop across the first D+ and second D− coupling nodes.

As exemplified in FIG. 4, the first $R_{D1}$ and second $R_{D2}$ resistive elements in the sensing circuit block 120 can be compliant with USB standard specifications, e.g., implying a total resistance value below 200Ω.

As exemplified in FIG. 4, the detection circuit block 122 includes:

a (e.g., Zener) diode $D_Z$ having one end (e.g., the cathode) coupled to the common node P of the sensing circuit block 120 and the other end (e.g., the anode) coupled to a I/O node GPIO of the control circuit block 124; and a capacitive element $C_M$ coupled to the I/O node GPIO of the control circuit block 124, the capacitive element $C_M$ being referred to ground.

Optionally, the detection circuit block 122 further includes a limiter element $R_{LIM}$ (e.g., a resistive element $R_{LIM}$) interposed between the diode $D_Z$, the capacitive element $C_M$ and the I/O node GPIO, the limiter element $R_{LIM}$ configured to protect the control circuit block 124 from receiving exceedingly high current levels in case of an overvoltage across the cable 13.

As exemplified in FIG. 4, the control circuit block 124 includes:

the I/O node GPIO configured to receive the electrical quantity from the testing circuit block 122;

an analog-to-digital converter (briefly, ADC) circuit 126, such as a 1-bit ADC circuit, coupled to the I/O node GPIO and configured to receive a voltage at the I/O node GPIO, the ADC circuit 126 further configured to provide a digital detection signal $D_S$ indicative of the voltage at the I/O node GPIO as a result; for instance, a first voltage level $V_{IH}$ (e.g., $V_{IH} \approx 2V$) may correspond to a first (e.g., "high" or "1") logic value, while a second voltage level $V_{IL}$ (e.g., $V_{IL} \approx 1V$) may correspond to a second (e.g., "low" or "0") logic level for the digital detection signal $D_S$;

a digital buffer circuit (such as tri-state digital buffer, known per se) 128 coupled to the I/O node GPIO and configured to provide thereto a driving signal DRV, forcing a voltage level at the I/O node GPIO as a result; for instance, a first voltage level VOH (e.g., $V_{OH} \approx 3.3V$) may correspond to a first (e.g., "high" or "1") logic level for the driving signal DRV, while a second voltage level $V_{OL}$ (e.g., $V_{OL} \approx 0V$) may correspond to a second (e.g., "low" or "0") logic level for the driving signal DRV;

a logic unit 129 coupled to the ADC circuit 126 to receive the detection signal $D_S$ therefrom and coupled to the digital buffer circuit 128 to provide the detection signal DRV thereto, the logic unit 129 configured to perform signal processing of the detection signal $D_S$ in response to asserting the drive signal DRV during the at least one testing method, in order to detect the presence or the absence of possible fault on the cables 13; and optionally, a further (e.g., analog) input node $A_{IN}$ configured to be coupled to the ADC circuit 126, the further node $A_{IN}$ configured to be coupled to an external ADC circuit, e.g., having an improved bit precision with respect to the 1-bit ADC 126.

As exemplified in FIG. 4, block 130 models the possible faults from which may affect the cable. For instance, such faults include:

a cable resistance $R_C$ which may have a fault resistance value equal to or lower than the threshold resistance value $R_{SHORT}$, e.g., a short circuit fault condition on the cable 13; and a voltage generator $V_C$ which may be an overvoltage $V_{FAULT}$ above the threshold voltage level $V_{OV}$.

In one or more embodiments, the control circuit block 124 is configured to perform at least one testing method regularly for brief time intervals, e.g., about 1 second while power supply is being provided normally to the load 14, without severely interrupting the power transfer.

In one or more embodiments, the control circuit block 124 is configured to perform a first testing method, including:

at a first time instant T1, asserting the drive signal DRV at the first logic value (e.g., "high" or "1");

in the hypothesis that the capacitive element $C_M$ is initially discharged, charging the capacitive element $C_M$ in the detection circuit block 122 until reaching (at a second time instant T2) the first voltage level $V_{OH}$ of the digital buffer circuit 128 in response to the digital buffer circuit 128 providing a converted drive signal DRV having the first voltage level $V_{OH}$ at the I/O node GPIO;

when the capacitance of the capacitive element $C_M$ is charged at time instant T2, coupling the input node of the digital buffer circuit 128 to an open circuit, leaving the corresponding input node of the digital buffer 128 floating at high impedance and also the I/O node GPIO free to have any value;

optionally, detecting the electrical quantity (e.g., voltage) at the I/O node GPIO and converting the electrical quantity (via ADC circuit 126) to a logic value of the digital detection signal logic level $D_S$;

waiting for a time-out time, e.g., $$\tau \ln \left( \frac{V_{OH}}{V_{IL}} \right)$$

and after the time-out time, alternatively:

in response to the digital sensing signal $D_S$ having the first logic value, de-asserting a fault flag signal F at the second logic value (e.g., "low" or "0") and asserting the drive signal DRV to the second logic level (in order to drive the I/O node GPIO back to ground), initiating a discharging process of the capacitive element $C_M$; or in response to the digital sensing signal $D_S$ having the second logic value, computing a resistance across the coupling pins D+, D− based on the time interval between the interruption of the assertion of the drive signal DRV and the time instant at which the digital sensing signal $D_S$ has switched to the second logic value, performing a comparison between the computed resistance value and the threshold resistance value $R_{SHORT}$ and by asserting a fault flag signal F to the first logic value (e.g., "high" or "1") via the logic unit 129 in case the comparison yields that the computed resistance fails to reach the threshold resistance value $R_{SHORT}$. For instance, the unit 124 may be configured to interrupt the power delivery from the power supply 11 to the load 14 in response to the fault flag signal F being asserted at the first logic value.

Figure 5:
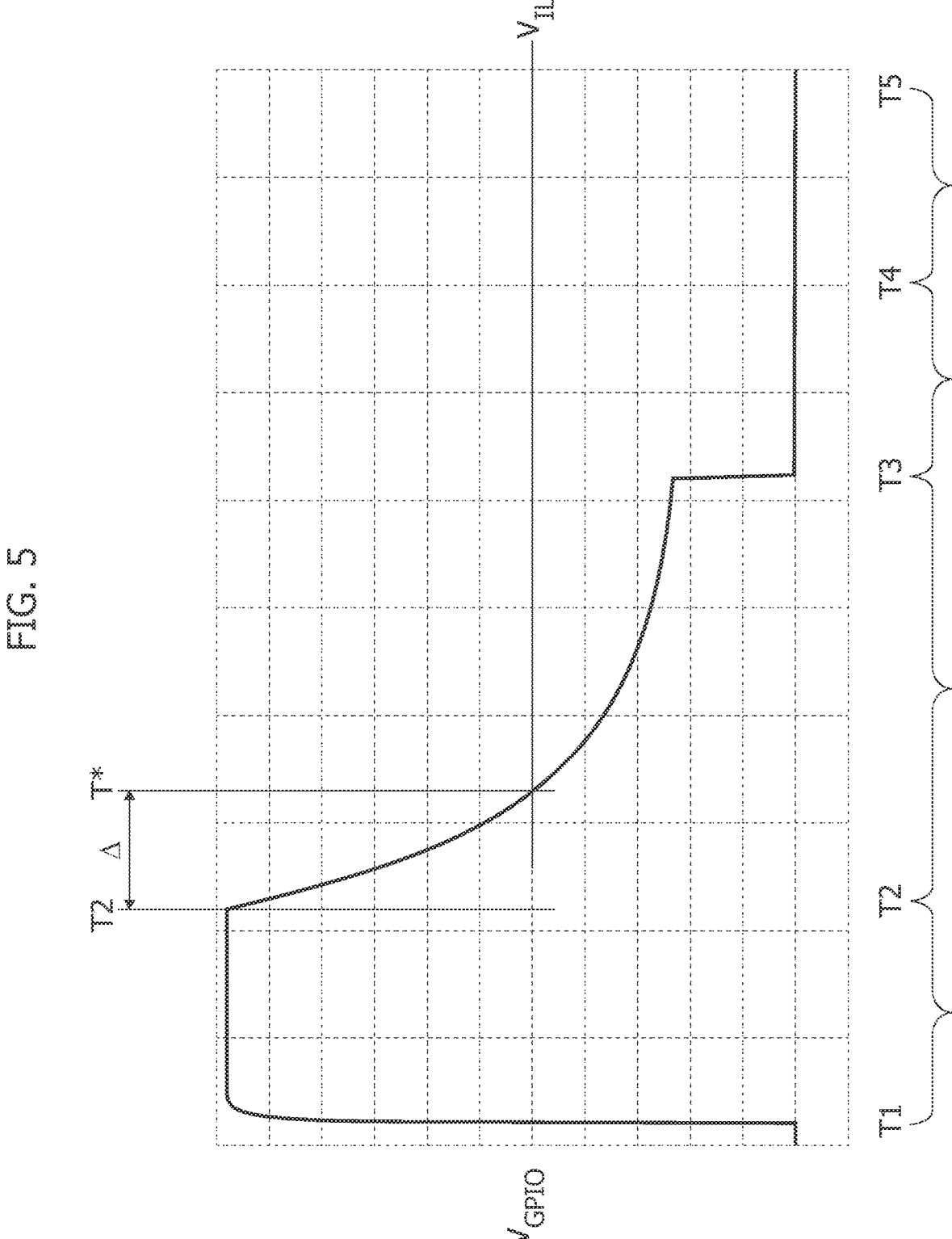
FIG. 5 is a time diagram of signals in one or more scenarios as per the present disclosure.

As exemplified in FIG. 5, in case the resistance $R_C$ of the cables 13 has a faulty value $R_{SHORT}$, after the second time instant $T_2$ the capacitive element $C_M$ begins discharging at a speed determined by the time constant $\tau = C_M \cdot R_C$, while the digital buffer circuit 128 is coupled at high impedance. Therefore, the ADC circuit 126 detects a voltage signal $V_{GPIO}$ at the I/O node GPIO which gradually decreases with respect to the desired first (e.g., "high") voltage level $V_{IH}$. As a result of the voltage signal dropping below the low logic level $V_{IL}$, at the time instant T* the sensing signal $D_S$ switches from the first (e.g., "high") logic level to the second (e.g., "low") logic level, e.g., after a decay time interval $\Delta$ which may be expressed as $$\Delta = \tau \ln \left( \frac{V_{OH}}{V_{IL}} \right).$$

As exemplified in FIG. 5, the logic unit 129 is configured to keep sensing the signal $D_S$ for a time interval T2-T3 longer than the "natural" voltage decay time interval $\tau$. Therefore, the switch of the logic level of the sensing signal $D_S$ is detected at time instant T* which is within the time-out time interval T2-T3.

For instance, the logic unit 129 is configured to compute the value of the cable resistance $R_C$, as:

$$R_C = \frac{t}{C_M \ln \left( \frac{V_{OH}}{V_{IL}} \right)}$$

For instance, the logic unit 129 is configured to perform a comparison between the computed value of resistance $R_C$ and the threshold resistance value $R_{SHORT}$, and to raise the fault flag signal F in response to the comparison yielding that the measured resistance fails to reach the resistance threshold value $R_{SHORT}$.

In an alternative scenario, the act of computing the resistance value may be optional: by setting the time-out time instant T3 to have a value equal to the "worst case scenario" decay time $\Delta_{WCS}$, that is the scenario in which the cable resistance $R_C$ is equal to the threshold resistance value $R_{SHORT}$, e.g., $$\Delta_{WCS} = R_{SHORT} C_{MEAS} \ln \left( \frac{V_{OH}}{V_{IL}} \right).$$

In such an alternative scenario, the logic unit 129 is configured to assert the fault flag signal F in response to the sensing signal $D_S$ switching from the high logic value to the low logic value at any time during the worst-case scenario decay time interval $\Delta_{WCS}$.

For instance, in both scenarios discussed above, after completing the first testing method, the control circuit block 124 may be configured to assert the drive signal back to the low voltage signal in order to drive the I/O node GPIO back to ground, fully discharging any voltage remaining on the capacitive element $C_M$ and therefore being able to perform again the same or another testing method.

Figure 5A:
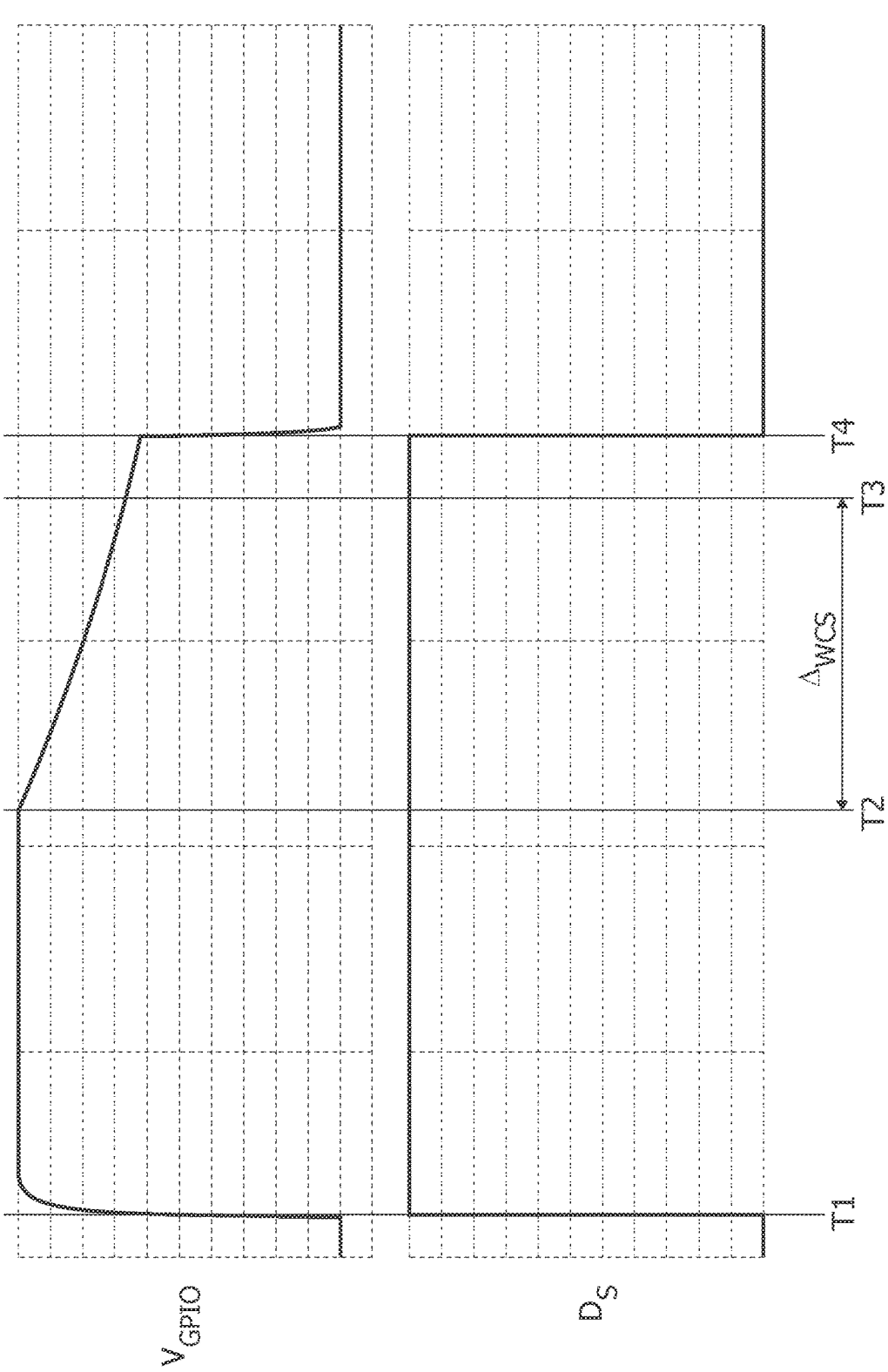
FIGS. 5A and 5B are time diagrams of signals in alternative scenarios as per the present disclosure.
Figure 5B:
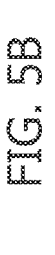

FIGS. 5A and 5B are exemplary time diagrams of signals in case the alternative testing method discussed above is applied to a cable that works properly (FIG. 5A), that is one having a resistance value above the threshold level $R_{SHORT}$, and to a faulty cable (FIG. 5B), that is one whose impedance is below the threshold resistance value $R_{SHORT}$.

As exemplified in FIG. 5A, in the case of a high-impedance cable:

at the first time instant $T_1$ the drive signal DRV is asserted, leading to the capacitive element $C_M$ beginning the charging process, with a voltage signal $V_{GPIO}$ at the I/O node GPIO increasing as a result;

at the second time instant T2, application of the drive signal DRV is interrupted, leaving the corresponding input node of the digital buffer 128 floating at high impedance;

at a third time instant T3 corresponding to a time-interval equal to the worst-case scenario time-interval $\Delta_{WCS}$ from the second time instant T2, the value of the sensing signal $D_S$ is "recorded" by the logic unit 129; as the sensing signal $D_S$ is at the first "high" value at the third time instance, the logic unit 129 correctly does not raise any fault flag signal F; and at a fourth time instant T4, the driving signal DRV is asserted at the second level for a short time in order to reset the voltage on $C_M$, facilitating repeating the testing method in a subsequent moment of the life of the cable.

As exemplified in FIG. 5B, in case of a faulty cable, the logic unit 129 received the sensing signal $D_S$ at the second "low" value and correctly raises a fault flag signal F in response to such detection.

In one or more embodiments, the control circuit block 124 is configured to perform a second testing method, including:

at a first time instant (e.g., after the reset discharge of the capacitive element $C_M$), coupling the input of the digital buffer circuit 128 to an open circuit, leaving it floating at high impedance; consequently, due to the breakdown voltage $V_Z$ of the Zener diode $D_Z$, the voltage $V_{GPIO}$ on the I/O node GPIO becomes equal to the average voltage $V_P$ minus the breakdown voltage $V_Z$, e.g., $V_{GPIO}=V_P-V_Z=(V_{D-}+V_{D+})/2-V_Z$.

Selecting an appropriate value for the voltage breakdown of the diode $V_Z$, it is possible to obtain an indication of the presence or absence of an overvoltage condition $V_{FAULT}$ on the cables.

Specifically, selecting the Zener breakdown voltage to be equal to $$V_Z = V_{OV} - V_{IH}$$

where:

$V_{OV}$ is the overvoltage threshold level; and $V_{IH}$ is the "low" voltage level corresponding to the "low" logic value of the ADC 126.

For instance, the sensing signal $D_S$ reaches a first (e.g., "high") logic value in response to the average voltage $V_P$ across ground and any coupling node of the coupling nodes D+, D− being higher than the overvoltage threshold value $V_{FAULT}$.

Therefore, the logic unit 129 is configured to raise the fault flag signal F (or an additional fault flag signal) in response to the sensing signal $D_S$ having a high logic level during performance of the second testing method.

Figure 6:
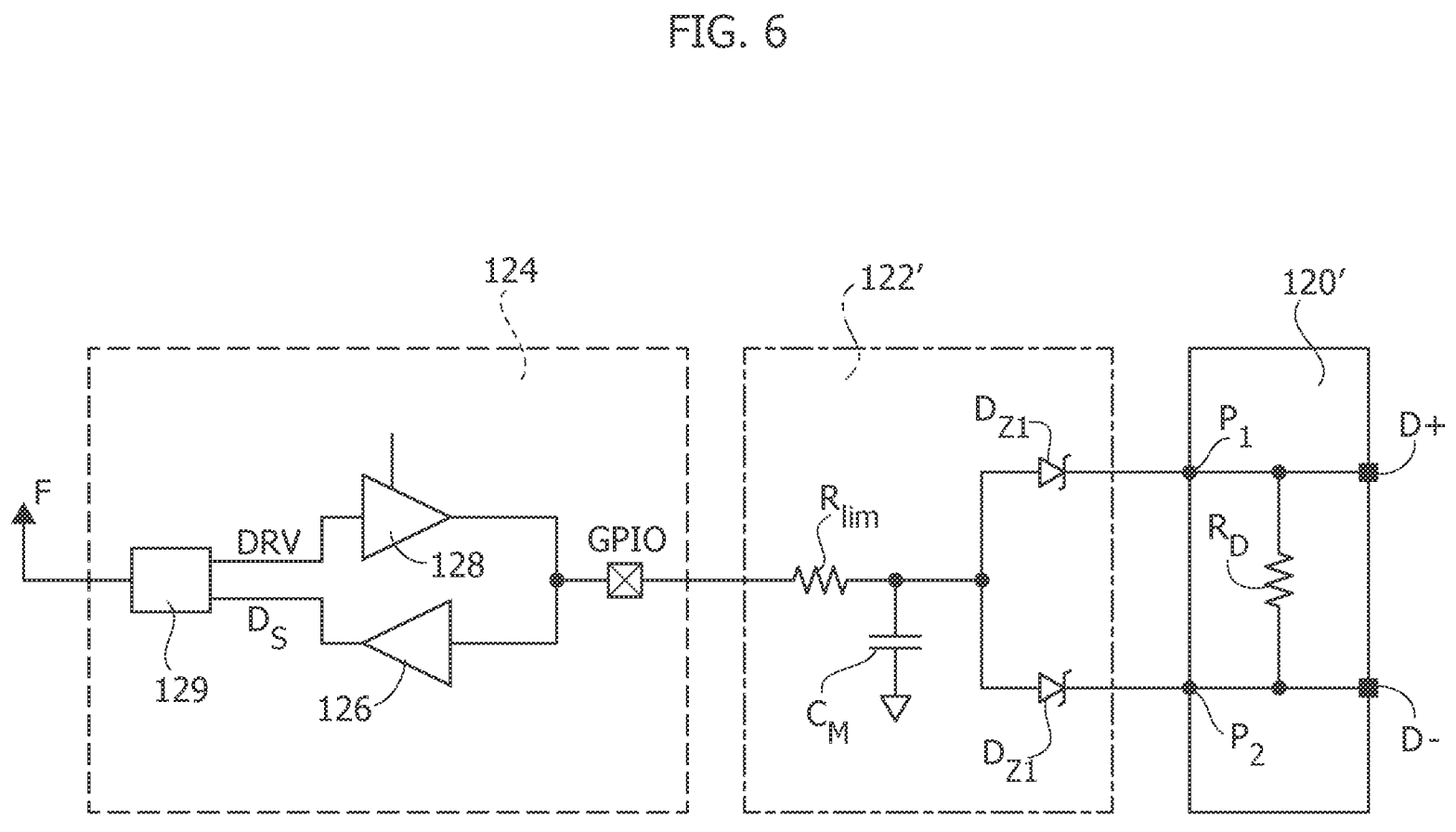

As exemplified in FIG. 6, in one or more alternative scenarios:

an alternative sensing circuit block 120' includes a single resistive element RD in place of the two resistive elements RD1, RD2, e.g., RD=RD1+RD2; and an alternative testing circuit block 122' includes a pair of (e.g., Zener) diodes $D_{Z1}$, $D_{Z2}$ including a first diode DZ1 interposed between the I/O node GPIO and the first coupling node D+ and a second diode $D_{Z2}$ interposed between the I/O node GPIO and the second coupling node D−.

A solution as exemplified in FIG. 6 may increase accuracy of the second testing method in measuring the presence of any overvoltage, by measuring the highest among the voltages $V_{D-}$, $V_{D+}$ at the respective coupling nodes D+, D− instead of the average of the two voltages $V_{D-}$, $V_{D+}$.

Figure 7A:
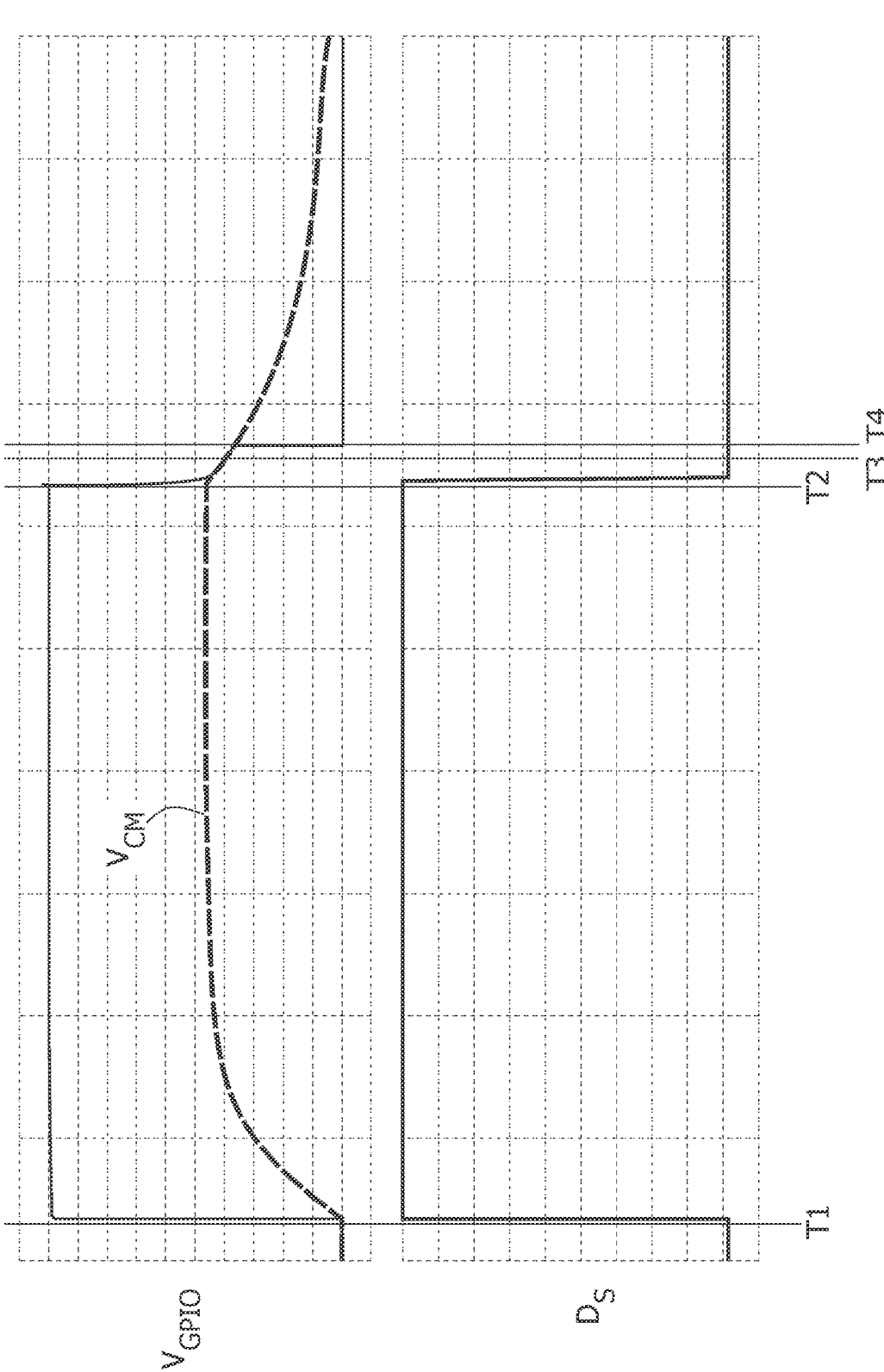
FIGS. 7A and 7B are time diagrams of signals in one or more alternative scenarios as per the present disclosure.
Figure 7B:
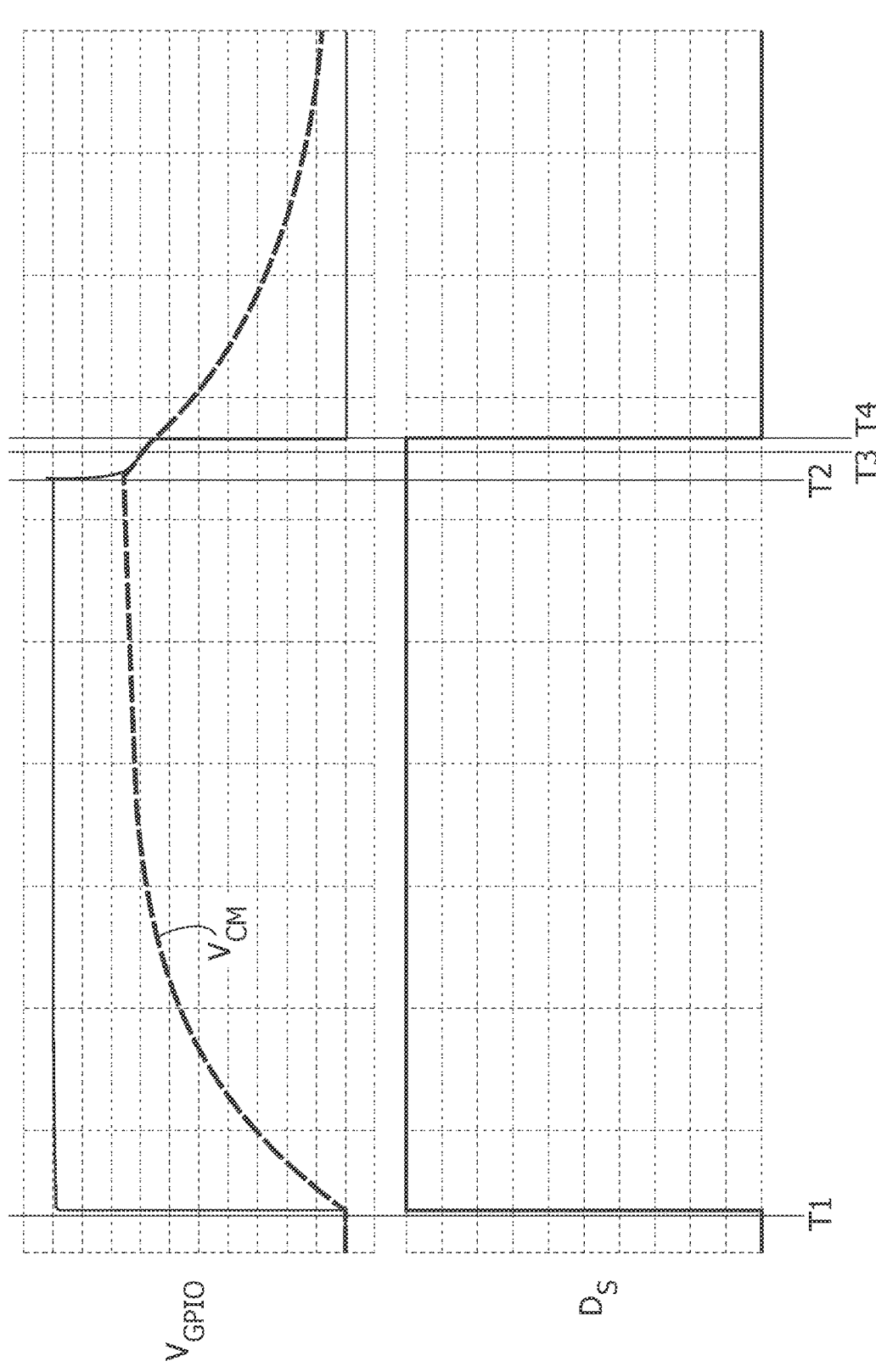

As exemplified in FIGS. 7A and 7B further alternatives may be envisaged.

Specifically, one or more embodiments discussed in the foregoing are based on the observation that the time-constant of the discharge process of the capacitive element $C_M$ varies if the resistance of the cable goes below the resistance threshold value $R_{SHORT}$.

In the alternative scenario exemplified in FIGS. 7A and 7B, voltage may be used as an indicator of the presence or not of a cable impedance lower than expected, exploiting the voltage divider which would be formed among the cable resistance $R_C$ and the limiting resistive element $R_{LIM}$, further exploiting the capacitive element $C_M$ as a temporary storage for that voltage, as discussed in the following.

As exemplified in FIGS. 7A and 7B, in an alternative scenario in which the limiting element $R_{LIM}$ is present in the circuit 122, 122' (e.g., with a value of limiting resistance $R_{LIM}$ close to the resistance threshold value $R_{SHORT}$) it may be possible to design the capacitance of the capacitive element $C_{MEAS}$ to be high enough to slow-down the discharge process, keeping an almost stable voltage for a time interval during which the I/O node GPIO is left in high impedance.

In such an exemplary scenario, the first testing method includes:

at the first time instant $T_1$ the drive signal DRV is asserted for a (e.g., short) time interval, leading to the capacitive element $C_M$ beginning the charging process, with a voltage signal $V_{GPIO}$ at the I/O node GPIO increasing as a result; for instance, the capacitor $C_M$ is charged so as to have a stored voltage $V_{CM}$ until the stored voltage $V_{CM}$ reaches a limit voltage V, e.g., $$V = V_{OH} \frac{R_{fault}}{R_{fault} + R_{lim}};$$

at the second time instant $T_2$, application of the drive signal DRV is interrupted, leaving the corresponding input node of the digital buffer 128 floating at high impedance;

at the third time instant T3, close to the second time instant T2 to limit the effects of the capacitor discharging through the faulty cable resistance $R_C$, the voltage $V_{GPIO}$ at the I/O node GPIO is sensed via the ADC 126, providing the corresponding sensing signal $D_S$ to the logic unit 129; the logic unit 129 is configured to calculate the cable resistance $R_C$ present on the cable as discussed in the foregoing, e.g., $$R_C = R_{lim} \frac{V}{V_{OH} - V};$$

at the fourth time instant T4, the method includes asserting the driving signal DRV to the second logic level in order to reset the voltage on $C_M$, facilitating repeating the testing method in a subsequent moment of the life of the cable.

For instance, during the interval between the fourth time interval and the first time-interval of a new impedance-testing sequence, the overvoltage-testing sequence may be performed.

As exemplified in FIGS. 7A, in case of a low-impedance faulty cable the sensing signal has the second logic value during the time interval T2-T3, so that the logic unit 129 is configured to assert the fault flag signal F in response thereto; conversely, as exemplified in FIG. 7B, in case of a cable having a resistance above the resistance threshold value the sensing signal D$_S$ has the first logic value, so that the logic unit 129 is configured not to raise any fault flag signal F in response thereto.

In one or more embodiments, the ADC 126 may be configured to provide the sensing signal D$_S$ with the first logic value, respectively the second logic value, in response to the voltage at the I/O node GPIO being above, respectively below, a voltage which may be expressed as $$V_{IH} = V_{IL} = V_{OH} \frac{R_{SHORT}}{R_{SHORT} + R_{lim}}.$$

Alternatively, in one or more embodiments the threshold voltage of the ADC 126 may have different values V$_{IH}$, V$_{IL}$ previously discussed. In such an alternative scenario, the limiting element R$_{LIM}$ can be selected to have an alternative resistance value R'$_{LIM}$ which may be expressed as:

$$R'_{LIM} = R_{SHORT} \frac{V_{OH} - V_{IL}}{V_{IL}}$$

Thereby, if the fault resistance R$_C$ is higher than the resistance threshold value R$_{SHORT}$, the sensing signal has the first logic value during the time interval T2-T3 in which the I/O node GPIO is left in high impedance.

It is further noted than in the alternative scenario exemplified in FIGS. 7A and 7B the charge phase of the capacitive element C$_M$ is longer than that shown in FIGS. 5A and 5B, as a result of the presence of the limiting resistive element R$_{LIM}$ which increases the charging time constant.

As exemplified herein, a circuit 12 includes:

at least one coupling node D+, D− configured to be coupled, via a cable 13, to a load 16 to transmit a supply voltage thereto, the cable having a cable impedance R$_C$ (e.g., referred to ground) and configured to carry a cable voltage V$_C$ (e.g., the cable voltage V$_C$ equal to a voltage drop between a coupling node D+ or D− and ground); and test circuitry 122, 124 coupled to the at least one coupling node, the test circuitry configured to:

sense 126 at least one sensing signal V$_{GPIO}$ indicative of a value of the cable impedance and/or of a cable voltage across the cable;

perform a comparison between the at least one sensing signal and at least one threshold V$_{IL}$ indicative either of a threshold resistance value for the cable impedance or indicative of a threshold voltage value for the cable voltage;

produce a comparison signal D$_S$ as a result of the comparison, the comparison signal having a first logic value, resp. a second logic value, as a result of the at least one sensing signal reaching, resp. failing to reach, the at least one threshold, and assert a flag signal F based on the logic value of said comparison signal, the flag signal being indicative of the value of the cable impedance being lower than the threshold resistance value, and/or being indicative of a cable voltage across the wired cable being greater than the threshold voltage value.

As exemplified herein, the test circuit includes:

an input/output, I/O, node GPIO configured to provide the sensing signal;

at least one Zener diode D$_Z$; D$_{Z1}$, D$_{Z2}$ interposed to the at least one resistive element of the coupling circuit and the I/O node;

a capacitive element C$_M$ referred to ground coupled to the I/O node;

an analog-to-digital converter, ADC circuit 126 coupled to the I/O node to sense the sensing signal therefrom, the ADC circuit configured to perform said comparison, producing the comparison signal as a result; and a logic unit 129 coupled to the ADC circuit to receive the comparison signal therefrom.

For instance, the ADC circuit is configured to produce the comparison signal having the first logic value, resp. the second logic value, as a result of the at least one sensing signal reaching, resp. failing to reach, the at least one threshold.

For instance, the logic unit is configured to assert said flag signal based on the logic value of said comparison signal.

As exemplified herein, the test circuitry includes:

a digital buffer circuit 128 coupled to the logic unit and to the I/O node, the digital buffer circuit configured to receive a drive signal DRV from the logic unit and to apply a first voltage level, resp. a second voltage level, to the I/O node in response to the logic unit asserting the drive signal with a first, resp. second, logic value.

For instance, the test circuitry is configured to:

assert the drive signal with the first logic value during a first time-interval T1, T2, initiating charging the capacitive element as a result;

after lapse of the first time-interval, leave floating the drive signal during a second time interval T2, T3; Δ$_{WCS}$, initiating discharging of the capacitive element as a result;

assert the drive signal after lapse of the second time-interval Δ$_{WCS}$, resetting the capacitive element to a discharged state;

perform the comparison 126 between the at least one sensing signal and at least one threshold indicative of a threshold resistance value for the cable impedance during the discharge of the capacitive element at lapse of the second time interval, producing the comparison signal as a result of the comparison, the comparison signal having a first logic value, resp. a second logic value, as a result of the at least one sensing signal reaching, resp. failing to reach, the at least one threshold; and assert the flag signal based on the logic value of said comparison signal being indicative of the value of the cable impedance being lower than the threshold resistance value.

As exemplified herein, the circuit further includes at least one resistive element R$_{D1}$, R$_{D2}$; R$_D$; R$_{LIM}$ coupled to the test circuitry.

As exemplified herein, the circuit includes:

a digital buffer coupled to the logic unit and to the I/O node, the digital buffer circuit configured to receive a drive signal from the logic unit and to apply a first voltage level, resp. a second voltage level, to the I/O node (GPIO) in response to the logic unit (129) asserting the drive signal (DRV) with a first, resp. second, logic value.

For instance, the test circuitry is configured to:

assert the drive signal with the first logic value during a first time-interval T1, T2, initiating charging the capacitive element as a result;

leave floating the drive signal after lapse of the first
time-interval, initiating discharging of the capacitive
element as a result;

perform the comparison between the at least one sensing
signal and at least one threshold indicative of a thresh-
old resistance value for the cable impedance, producing
the comparison signal as a result of the comparison, the
comparison signal having a first logic value, resp. a
second logic value, as a result of the at least one sensing
signal reaching, resp. failing to reach, the at least one
threshold;

in response to the comparison signal having the second
logic value, calculating a decay time interval $\Delta$ between
a first time instant T1 of assertion of the drive signal
and a second time instant at which the comparison
signal $D_S$ transitions from the first logic value to the
second logic value;

computing a value of the cable resistance based on the
calculated decay time interval; and providing the computed cable resistance value to a user
circuit.

As exemplified herein, the cable is a cable compliant with
the universal serial bus standard.

As exemplified herein, a power adapter 10 includes:

a plug 11 configured to be coupled to a socket to receive
an AC voltage therefrom;

an AC/DC converter coupled to the plug 11 to receive the
AC voltage therefrom, the AC/DC converter configured
to provide a supply voltage based on an AC voltage;

a cable 13 having a cable impedance $R_C$ and configured to
carry a cable voltage $V_C$; and a circuit 12 according to any of the previous claim
coupled to the AC/DC converter to receive the supply
voltage therefrom and coupled to the cable 13 to
transmit the supply voltage to a load 16.

As exemplified herein, a method includes:

coupling at least one coupling node D+, D−, via a cable
13, to a load 16 to transmit a supply voltage thereto, the
cable having a cable impedance $R_C$ and configured to
carry a cable voltage $V_C$;

sensing 126 at least one sensing signal $V_{GPIO}$ indicative of
a value of the cable impedance $R_C$ and/or of a cable
voltage $V_C$ across the cable;

performing a comparison between the at least one sensing
signal and at least one threshold $V_{IL}$ indicative either of
a threshold resistance value for the cable impedance or
indicative of a threshold voltage value for the cable
voltage;

producing a comparison signal $D_S$ as a result of the
comparison, the comparison signal having a first logic
value, resp. a second logic value, as a result of the at
least one sensing signal reaching, resp. failing to reach,
the at least one threshold; and asserting a flag signal F based on the logic value of said
comparison signal, the asserted flag signal being
indicative of the value of the cable impedance being
lower than the threshold resistance value, and/or being
indicative of a cable voltage across the wired cable
being greater than the threshold voltage value.

As exemplified herein, the method includes:

asserting a drive signal DRV with the first logic value
during a first time-interval T1, T2;

after lapse of the first time-interval, leaving the drive
signal floating during a second time interval (T2, T3;
$\Delta_{WCS}$);

assert the drive signal after lapse of the second time-
interval $\Delta_{WCS}$;

performing the comparison between the at least one
sensing signal and at least one threshold indicative a
threshold resistance value for the cable impedance
during the discharge of the capacitive element at lapse
of the second time interval T2, T3; $\Delta_{WCS}$, producing the
comparison signal as a result of the comparison, the
comparison signal having a first logic value, resp. a
second logic value, as a result of the at least one sensing
signal reaching, resp. failing to reach, the at least one
threshold; and asserting the flag signal based on the logic value of said
comparison signal being indicative of the value of the
cable impedance being lower than the threshold resis-
tance value.

As exemplified herein, the method includes:

asserting the drive signal with the first value during a first
time-interval T1, T2;

leaving the drive signal floating after lapse of the first
time-interval, initiating discharging of the capacitive
element as a result;

performing the comparison between the at least one
sensing signal and at least one threshold indicative a
threshold resistance value for the cable impedance,
producing the comparison signal as a result of the
comparison, the comparison signal having a first logic
value, resp. a second logic value, as a result of the at
least one sensing signal reaching, resp. failing to reach,
the at least one threshold;

in response to the comparison signal having the second
logic value, calculating a decay time interval $\Delta$ between
a first time instant T1 of assertion of the drive signal
and a second time instant at which the comparison
signal $D_S$ transitions from the first logic value to the
second logic value;

computing a value of the cable resistance based on the
calculated decay time interval; and providing the computed cable resistance value to a user
circuit.

It will be otherwise understood that the various individual
implementing options exemplified throughout the figures
accompanying this description are not necessarily intended
to be adopted in the same combinations exemplified in the
figures. One or more embodiments may thus adopt these
(otherwise non-mandatory) options individually and/or in
different combinations with respect to the combination
exemplified in the accompanying figures.

Without prejudice to the underlying principles, the details
and embodiments may vary, even significantly, with respect
to what has been described by way of example only, without
departing from the extent of protection. The extent of
protection is defined by the annexed claims.

A circuit (12) may be summarized as including: at least
one coupling node (D+, D−) configured to be coupled, via a
cable (13), to a load (16) to transmit a supply voltage thereto,
the cable (13) having a cable impedance ($R_C$) and configured
to carry a cable voltage ($V_C$); test circuitry (122, 124)
coupled to the at least one coupling node (D+, D−), the test
circuitry (122, 124) configured to: sense (126) at least one
sensing signal ($V_{GPIO}$) indicative of a value of the cable
impedance ($R_C$) and/or of a cable voltage ($V_C$) across the
cable (13); perform a comparison (126) between the at least
one sensing signal ($V_{GPIO}$) and at least one threshold ($V_{IL}$)
indicative either of a threshold resistance value for the cable
impedance ($R_C$) or indicative of a threshold voltage value
for the cable voltage ($V_C$); produce a comparison signal ($D_S$)
as a result of the comparison, the comparison signal ($D_S$)
having a first logic value, resp. a second logic value, as a result of the at least one sensing signal ($V_{GPIO}$) reaching, resp. failing to reach, the at least one threshold ($V_{IL}$), and assert a flag signal (F) based on the logic value of said comparison signal ($D_S$), the flag signal (F) being indicative of the value of the cable impedance ($R_C$) being lower than the threshold resistance value, and/or being indicative of a cable voltage ($V_C$) across the wired cable (13) being greater than the threshold voltage value.

The test circuit (122, 124) may include: an input/output, I/O, node (GPIO) configured to provide the sensing signal ($V_{GPIO}$); at least one Zener diode ($D_Z$; $D_Z$, $D_{Z2}$) interposed to the at least one resistive element ($R_{D1}$, $R_{D2}$; $R_D$) of the coupling circuit (120) and the I/O node (GPIO); a capacitive element ($C_M$) referred to ground coupled to the I/O node (GPIO); an analog-to-digital converter, ADC circuit (126) coupled to the I/O node (GPIO) to sense the sensing signal ($V_{GPIO}$) therefrom, the ADC circuit (126) configured to perform said comparison, producing the comparison signal ($D_S$) as a result, and a logic unit (129) coupled to the ADC circuit (126) to receive the comparison signal ($D_S$) therefrom, wherein: the ADC circuit (126) is configured to produce the comparison signal ($D_S$) having the first logic value, resp. the second logic value, as a result of the at least one sensing signal ($V_{GPIO}$) reaching, resp. failing to reach, the at least one threshold ($V_{IL}$), and the logic unit (129) is configured to assert said flag signal (F) based on the logic value of said comparison signal ($D_S$).

The test circuitry (122, 124) may include: a digital buffer circuit (128) coupled to the logic unit (129) and to the I/O node (GPIO), the digital buffer circuit (128) configured to receive a drive signal (DRV) from the logic unit (129) and to apply a first voltage level, resp. a second voltage level, to the I/O node (GPIO) in response to the logic unit asserting the drive signal (DRV) with a first, resp. second, logic value; wherein the test circuitry (122, 124) is configured to: assert the drive signal (DRV) with the first logic value during a first time-interval (T1, T2), initiating charging the capacitive element ($C_M$) as a result; after lapse of the first time-interval (T1, T2), leave floating the drive signal (DRV) during a second time interval (T2, T3; $\Delta_{WCS}$), initiating discharging of the capacitive element ($C_M$) as a result; assert the drive signal (DRV) after lapse of the second time-interval ($\Delta_{WCS}$), resetting the capacitive element ($C_M$) to a discharged state; perform the comparison (126) between the at least one sensing signal ($V_{GPIO}$) and at least one threshold ($V_{IL}$) indicative of a threshold resistance value for the cable impedance ($R_C$) during the discharge of the capacitive element ($C_M$) at lapse of the second time interval (T2, T3; $\Delta_{WCS}$), producing the comparison signal ($D_S$) as a result of the comparison (126), the comparison signal ($D_S$) having a first logic value, resp. a second logic value, as a result of the at least one sensing signal ($V_{GPIO}$) reaching, resp. failing to reach, the at least one threshold ($V_{IL}$), and assert the flag signal (F) based on the logic value of said comparison signal ($D_S$) being indicative of the value of the cable impedance ($R_C$) being lower than the threshold resistance value.

The circuit may further include at least one resistive element (RD1, RD2; RD; RLIM) coupled to the test circuitry (122, 124).

The circuit may include: a digital buffer (128) coupled to the logic unit (129) and to the I/O node (GPIO), the digital buffer circuit (128) configured to receive a drive signal (DRV) from the logic unit (129) and to apply a first voltage level, resp. a second voltage level, to the I/O node (GPIO) in response to the logic unit (129) asserting the drive signal (DRV) with a first, resp. second, logic value; wherein the test circuitry (122, 124) is configured to: assert the drive signal (DRV) with the first logic value during a first time-interval (T1, T2), initiating charging the capacitive element ($C_M$) as a result, leave floating the drive signal (DRV) after lapse of the first time-interval (T1, T2), initiating discharging of the capacitive element ($C_M$) as a result, perform the comparison (126) between the at least one sensing signal ($V_{GPIO}$) and at least one threshold ($V_{IL}$) indicative of a threshold resistance value for the cable impedance ($R_C$), producing the comparison signal ($D_S$) as a result of the comparison (126), the comparison signal ($D_S$) having a first logic value, resp. a second logic value, as a result of the at least one sensing signal ($V_{GPIO}$) reaching, resp. failing to reach, the at least one threshold ($V_{IL}$), in response to the comparison signal ($D_S$) having the second logic value, calculating a decay time interval ($\Delta$) between a first time instant (T1) of assertion of the drive signal (DRV) and a second time instant at which the comparison signal ($D_S$) transitions from the first logic value to the second logic value, computing a value of the cable resistance ($R_C$) based on the calculated decay time interval ($\Delta$), and providing the computed cable resistance value to a user circuit.

The cable (13) may be a cable compliant with the universal serial bus standard.

A power adapter (10), may be summarized as including: a plug (11) configured to be coupled to a socket to receive an AC voltage therefrom, an AC/DC converter coupled to the plug (11) to receive the AC voltage therefrom, the AC/DC converter configured to provide a supply voltage based on an AC voltage, a cable (13) having a cable impedance ($R_C$) and configured to carry a cable voltage ($V_C$), a circuit (12) according to any of the previous claim coupled to the AC/DC converter to receive the supply voltage therefrom and coupled to the cable (13) to transmit the supply voltage to a load (16).

A method, may be summarized as including: coupling at least one coupling node (D+, D−), via a cable (13), to a load (16) to transmit a supply voltage thereto, the cable (13) having a cable impedance ($R_C$) and configured to carry a cable voltage ($V_C$); sensing (126) at least one sensing signal ($V_{GPIO}$) indicative of a value of the cable impedance ($R_C$) and/or of a cable voltage ($V_C$) across the cable (13); performing a comparison (126) between the at least one sensing signal ($V_{GPIO}$) and at least one threshold ($V_{IL}$) indicative either of a threshold resistance value for the cable impedance ($R_C$) or indicative of a threshold voltage value for the cable voltage ($V_C$); producing a comparison signal ($D_S$) as a result of the comparison, the comparison signal ($D_S$) having a first logic value, resp. a second logic value, as a result of the at least one sensing signal ($V_{GPIO}$) reaching, resp. failing to reach, the at least one threshold ($V_{IL}$), and asserting a flag signal (F) based on the logic value of said comparison signal ($D_S$), the asserted flag signal (F) being indicative of the value of the cable impedance ($R_C$) being lower than the threshold resistance value, and/or being indicative of a cable voltage ($V_C$) across the wired cable (13) being greater than the threshold voltage value.

The method may include: asserting a drive signal (DRV) with the first logic value during a first time-interval (T1, T2); after lapse of the first time-interval (T1, T2), leaving the drive signal (DRV) floating during a second time interval (T2, T3; $\Delta_{WCS}$); assert the drive signal (DRV) after lapse of the second time-interval ($\Delta_{WCS}$); performing the comparison (126) between the at least one sensing signal ($V_{GPIO}$) and at least one threshold ($V_{IL}$) indicative a threshold resistance value for the cable impedance ($R_C$) during the discharge of the capacitive element ($C_M$) at lapse of the second time interval (T2, T3; $\Delta_{WCS}$), producing the comparison signal ($D_S$) as a result of the comparison (126), the comparison signal ($D_S$) having a first logic value, resp. a second logic value, as a result of the at least one sensing signal ($V_{GPIO}$) reaching, resp. failing to reach, the at least one threshold ($V_{IL}$), and asserting the flag signal (F) based on the logic value of said comparison signal ($D_S$) being indicative of the value of the cable impedance ($R_C$) being lower than the threshold resistance value.

The method may include: asserting the drive signal (DRV) with the first value during a first time-interval (T1, T2), leaving the drive signal (DRV) floating after lapse of the first time-interval (T1, T2), initiating discharging of the capacitive element ($C_M$) as a result, performing the comparison (126) between the at least one sensing signal ($V_{GPIO}$) and at least one threshold ($V_{IL}$) indicative a threshold resistance value for the cable impedance ($R_C$), producing the comparison signal ($D_S$) as a result of the comparison (126), the comparison signal ($D_S$) having a first logic value, resp. a second logic value, as a result of the at least one sensing signal ($V_{GPIO}$) reaching, resp. failing to reach, the at least one threshold ($V_{IL}$), in response to the comparison signal ($D_S$) having the second logic value, calculating a decay time interval ($\Delta$) between a first time instant (T1) of assertion of the drive signal (DRV) and a second time instant at which the comparison signal ($D_S$) transitions from the first logic value to the second logic value, computing a value of the cable resistance ($R_C$) based on the calculated decay time interval ($\Delta$), and providing the computed cable resistance value to a user circuit.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
at least one coupling node configured to be coupled, via a cable, to a load to transmit a supply voltage thereto, the cable having a cable impedance and configured to carry a cable voltage; and
test circuitry coupled to the at least one coupling node, the test circuitry configured to:
sense at least one sensing signal indicative of a value of the cable impedance and/or of a cable voltage across the cable;
perform a comparison between the at least one sensing signal and at least one threshold indicative either of a threshold resistance value for the cable impedance or indicative of a threshold voltage value for the cable voltage;
produce a comparison signal as a result of the comparison, the comparison signal having a first logic value or a second logic value, as a result of the at least one sensing signal reaching or failing to reach the at least one threshold; and
assert a flag signal based on the logic value of the comparison signal, the flag signal being indicative of the value of the cable impedance being lower than the threshold resistance value or being indicative of a cable voltage across the wired cable being greater than the threshold voltage value, wherein the test circuit includes:

an I/O node configured to provide the sensing signal;
at least one Zener diode interposed to the at least one resistive element of the coupling circuit and the I/O node;
a capacitive element coupled between ground and the I/O node;
an analog-to-digital converter circuit coupled to the I/O node to sense the sensing signal therefrom, the analog-to-digital converter circuit configured to perform the comparison and to produce the comparison signal based on the comparison; and
a logic unit coupled to the ADC circuit to receive the comparison signal from the analog-to-digital converter circuit, wherein the ADC circuit is configured to produce the comparison signal having the first logic value or the second logic value based on the at least one sensing signal reaching or failing to reach the at least one threshold and the logic unit is configured to assert the flag signal based on the logic value of the comparison signal.

2. The circuit of claim 1, wherein the test circuitry includes:
a digital buffer circuit coupled to the logic unit and to the I/O node, the digital buffer circuit configured to receive a drive signal from the logic unit and to apply a first voltage level or a second voltage level to the I/O node in response to the logic unit asserting the drive signal with a first logic value or a second logic value,
wherein the test circuitry is configured to:
assert the drive signal with the first logic value during a first time-interval to initiate charging the capacitive element;
after lapse of the first time-interval, leave floating the drive signal during a second time interval to initiate discharging of the capacitive element;
assert the drive signal after lapse of the second time-interval to reset the capacitive element to a discharged state;
perform the comparison between the at least one sensing signal and at least one threshold indicative of a threshold resistance value for the cable impedance during the discharge of the capacitive element at lapse of the second time interval and to produce the comparison signal as a result of the comparison, the comparison signal having a first logic value or a second logic value based on the at least one sensing signal reaching or failing to reach the at least one threshold; and
assert the flag signal based on the logic value of the comparison signal being indicative of the value of the cable impedance being lower than the threshold resistance value.

3. The circuit of claim 2, further comprising at least one resistive element coupled to the test circuitry.

4. The circuit of claim 1, comprising:
a digital buffer coupled to the logic unit and to the I/O node, the digital buffer circuit configured to receive a drive signal from the logic unit and to apply a first voltage level or a second voltage level to the I/O node based on the logic unit asserting the drive signal with a first logic value or a second, logic value,
wherein the test circuitry is configured to:
assert the drive signal with the first logic value during a first time-interval to initiate charging the capacitive element;

leave floating the drive signal after lapse of the first time-interval, to initiate discharging of the capacitive element;

perform the comparison between the at least one sensing signal and at least one threshold indicative of a threshold resistance value for the cable impedance and to produce the comparison signal as a result of the comparison, the comparison signal having a first logic value logic value or a second logic value, as a result of the at least one sensing signal reaching, resp. failing to reach, the at least one threshold;

in response to the comparison signal having the second logic value, calculate a decay time interval between a first time instant of assertion of the drive signal and a second time instant at which the comparison signal transitions from the first logic value to the second logic value;

compute a value of the cable resistance based on the calculated decay time interval; and provide the computed cable resistance value to a user circuit.

5. The circuit of claim 1, wherein the cable is compliant with the universal serial bus standard.

6. A method, comprising:

coupling at least one coupling node, via a cable, to a load to transmit a supply voltage thereto, the cable having a cable impedance and configured to carry a cable voltage;

sensing at least one sensing signal indicative of a value of the cable impedance or of the cable voltage across the cable;

performing a comparison between the at least one sensing signal and at least one threshold indicative either of a threshold resistance value for the cable impedance or indicative of a threshold voltage value for the cable voltage;

producing a comparison signal as a result of the comparison, the comparison signal having a first logic value or a second logic value based on the at least one sensing signal reaching or failing to reach the at least one threshold;

asserting a flag signal based on the logic value of the comparison signal, the asserted flag signal being indicative of the value of the cable impedance being lower than the threshold resistance value, or being indicative of a cable voltage across the wired cable being greater than the threshold voltage value; and asserting a drive signal with the first logic value during a first time-interval;

after lapse of the first time-interval, leaving the drive signal floating during a second time interval;

asserting the drive signal after lapse of the second time-interval;

performing the comparison between the at least one sensing signal and at least one threshold indicative a threshold resistance value for the cable impedance during the discharge of the capacitive element at lapse of the second time interval, producing the comparison signal as a result of the comparison, the comparison signal having a first logic value or a second logic value, as a result of the at least one sensing signal reaching or failing to reach, the at least one threshold; and asserting the flag signal based on the logic value of the comparison signal being indicative of the value of the cable impedance being lower than the threshold resistance value.

7. The method of claim 6, comprising:

asserting the drive signal with the first value during a first time-interval;

initiating discharging of the capacitive element by leaving the drive signal floating after lapse of the first time-interval;

performing the comparison between the at least one sensing signal and at least one threshold indicative a threshold resistance value for the cable impedance and producing the comparison signal as a result of the comparison, the comparison signal having a first logic value or a second logic value, as a result of the at least one sensing signal reaching or failing to reach the at least one threshold;

in response to the comparison signal having the second logic value, calculating a decay time interval between a first time instant of assertion of the drive signal and a second time instant at which the comparison signal transitions from the first logic value to the second logic value;

computing a value of the cable resistance based on the calculated decay time interval; and providing the computed cable resistance value to a user circuit.

8. The method of claim 6, wherein the cable is compliant with the universal serial bus standard.

9. A device, comprising:

a transmission interface including:

a first coupling node configured to be coupled to a cable;

a sensing circuit coupled to the first coupling node and configured to sense an electrical quantity of the cable via the first coupling node, wherein the sensing circuit includes a first resistor coupled to the first coupling node and a Zener diode coupled to the first resistor;

a testing circuit coupled to the sensing circuit and configured to provide a signal indicative of an operational condition of the cable based on the electrical quantity; and a control circuit coupled to the testing circuit and configured to drive the testing circuit block to perform a test on the coupling node and to receive the signal from the testing circuit based on the test, wherein the control circuit includes a single bit ADC configured to receive the signal from the testing circuit, a logic circuit coupled to an output of the single-bit ADC and configured to assert a flag indicative of a fault in the cable based on the signal, and a tri-state buffer including an input coupled to the logic circuit and an output coupled to the input of the single-bit ADC.

10. The device of claim 9, wherein the transmission interface includes a second coupling node configured to be coupled to the cable, wherein the sensing circuit includes a second resistor coupled between the second coupling node and the first resistor.

11. The device of claim 9, wherein the testing circuit includes a capacitor coupled between the Zener diode and ground.

12. The device of claim 11, wherein the testing circuit includes a limiting resistor coupled to the capacitor and the Zener diode.

13. The device of claim 9, comprising:

a plug configured to be coupled to a socket to receive an AC voltage; and an AC/DC converter coupled to the plug to receive the AC voltage and to provide a supply voltage based on the AC voltage;

wherein the transmission interface is coupled to the AC/DC converter to receive the supply voltage therefrom and is configured to transmit the supply voltage to a load via the cable.

\* \* \* \* \*